(12) United States Patent
Sundström et al.

(10) Patent No.: US 11,476,860 B2
(45) Date of Patent: Oct. 18, 2022

(54) SUB-ADC ASSIGNMENT IN TI-ADC

(71) Applicant: Telefonaktiebolaget LM Ericsson (publ), Stockholm (SE)

(72) Inventors: Lars Sundström, Södra Sandby (SE); Mattias Palm, Bara (SE); Roland Strandberg, Furulund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/278,793

(22) PCT Filed: Oct. 22, 2018

(86) PCT No.: PCT/EP2018/078867
§ 371 (c)(1),
(2) Date: Mar. 23, 2021

(87) PCT Pub. No.: WO2020/083461
PCT Pub. Date: Apr. 30, 2020

(65) Prior Publication Data
US 2022/0029631 A1    Jan. 27, 2022

(51) Int. Cl.
H03M 1/06 (2006.01)
H03M 1/10 (2006.01)
H03M 1/12 (2006.01)

(52) U.S. Cl.
CPC ....... H03M 1/0675 (2013.01); H03M 1/0673 (2013.01); H03M 1/0678 (2013.01);
(Continued)

(58) Field of Classification Search
CPC ............ H03M 1/0675; H03M 1/1215; H03M 1/0678; H03M 1/1004; H03M 1/1009; H03M 1/0673
(Continued)

(56) References Cited

U.S. PATENT DOCUMENTS 6,459,394 B1    10/2002  Itani et al.
7,250,885 B1 *   7/2007  Nairn .................. H03M 1/1215
                                                341/155
(Continued)

FOREIGN PATENT DOCUMENTS

EP      2827499 A2    1/2015
WO   2014135685 A1    9/2014

OTHER PUBLICATIONS

Elbornsson, J., et al., "Analysis of Mismatch Noise in Randomly Interleaved ADC System", Linköpings Universitet, Dept. of Electrical Engineering and Infineon Technologies, 2003, pp. 1-4.
(Continued)

*Primary Examiner* — Khai M Nguyen
(74) *Attorney, Agent, or Firm* — Murphy, Bilak & Homiller, PLLC (57) ABSTRACT

A TI-ADC (50) comprising a group of sub-ADCs ($A_1$-$A_{M+N}$) is disclosed. During operation, M≥2 of the sub-ADCs ($A_1$-$A_{M+N}$) are simultaneously operated for converting M respective consecutive input signal samples of the TI-ADC (50) from an analog to a digital representation. The total number of sub-ADCs ($A_1$-$A_{M+N}$) in the group is M+N, N≥1. The TI-ADC (50) comprises error-estimation circuitry (60) for estimating errors of the sub-ADCs ($A_1$-$A_{M+N}$). Furthermore, the TI-ADC (50) comprises a control circuit (55) configured to, for each input signal sample, assign which sub-ADC ($A_1$-$A_{M+N}$) is to operate on that input signal sample. The control circuit (55) is configured to, for sub-ADCs ($A_{k^1}$) in a first subset of the group of sub-ADCs ($A_1$-$A_{M+N}$), which are subject to error estimation by the error-estimation circuitry (60), perform the assignment according to a first scheme. Moreover, the control N circuit (55) is configured to, for sub-ADCs ($A_{k^2}$) in a second subset of the group of sub-ADCs ($A_1$-$A_{M+N}$), which are not subject to error estimation by the error-estimation circuitry (60),
(Continued)

perform the assignment according to a second scheme, different from the first scheme.

15 Claims, 5 Drawing Sheets

(52) U.S. Cl.
CPC ....... *H03M 1/1004* (2013.01); *H03M 1/1009* (2013.01); *H03M 1/1215* (2013.01)

(58) Field of Classification Search
USPC .................................................. 341/118, 155
See application file for complete search history.

(56) References Cited

U.S. PATENT DOCUMENTS

| | | | |
|---|---|---|---|
| 7,292,170 B2 | 11/2007 | Kinyua et al. | |
| 8,730,072 B2 | 5/2014 | Petigny et al. | |
| 8,890,729 B2 | 11/2014 | Lewis et al. | |
| 9,294,112 B1 | 3/2016 | Devarajan et al. | |
| 9,525,428 B2 | 12/2016 | Devarajan et al. | |
| 9,608,652 B2 * | 3/2017 | Lee | H03M 1/002 |

OTHER PUBLICATIONS

El-Sankary, K., "New sampling method to improve the SFDR of time-interleaved ADCs", Proceedings of the 2003 International Symposium on Circuits and Systems, Jun. 14-18, 2009, pp. 833-836.

Jin, Huawen, et al., "Time-Interleaved A/D Converter with Channel Randomization", 1997 IEEE International Symposium on Circuits and Systems, Hong Kong, Jun. 9-12, 1997, pp. 425-428.

Moule, Eric C., et al., "A Time-Interleaved ADC Multiplexed by a Blue-Noise Randomization Method", Dept. of Electrical and Computer Engineering, University of Rochester, Rochester, NY, 2005, pp. 1-4.

Tamba, Mamoru, et al., "A Method to Improve SFDR with Random Interleaved Sampling Method", ITC International Test Conference, Paper 18.3, IEEE, 2001, pp. 512-520.

Vogel, Christian, et al., "Spectral Shaping of Timing Mismatches in Time-Interleaved Analog-to-Digital Converters", IEEE, 2005, pp. 1394-1397.

* cited by examiner

SUB-ADC ASSIGNMENT IN TI-ADC

TECHNICAL FIELD

The present disclosure relates to time-interleaved analog-to-digital converters.

BACKGROUND

Wireless communication technologies continue to evolve to meet the demand for increased data throughput. This is addressed on many levels with different approaches including higher order modulation, MIMO (Multiple Input Multiple Output), scheduling, increased bandwidth, and so on. In particular, higher frequencies than commonly used today, and mmW frequencies in particular, have attracted a lot of interest since there are larger blocks of continuous spectra available, up to a several GHz. A mmW-based air interface is one important component of a forthcoming 5G standard. Already today there is an amendment to the Wi-Fi standard, 802.11ad, which specifies operation in the 60 GHz range with a channel bandwidth of 2.16 GHz.

To accommodate such large bandwidths while being reasonably power efficient so called time-interleaved ADCs (TI-ADC) are commonly used. A basic TI-ADC consists of M sub-ADCs, each operating at the same clock frequency $f_s$ but at different phases of that same clock so as to effectively yield a conversion rate of $M \times f_s$ when the outputs of the sub-ADCs are recombined. The sub-ADCs are typically implemented as SAR, pipeline, or flash ADCs, or hybrids of those schemes. The time-interleaving is required as the individual sub-ADCs cannot be designed to operate accurately and/or power efficient enough at the aggregated conversion rate of $M \times f_s$.

The disadvantage with TI-ADCs is that mismatch effects that appear between sub-ADCs (timing, phase, gain, DC offset, transfer function) lead to poor spurious-free dynamic range (SFDR) and signal image effects if not handled. One means of handling these mismatch effects is to introduce N additional, redundant, sub-ADCs such that for each sample to convert there is two or more sub-ADCs to choose from, as opposed to one in the conventional TI-ADC, see for instance U.S. Pat. No. 9,525,428 B2. Furthermore, the selection is made (pseudo-) randomly to distribute the errors across frequencies and thus improves SFDR.

Yet another way of dealing with the mismatch effects is to cancel them. This requires an error estimation mechanism that captures the degree of mismatch between the sub-ADCs, e.g. the difference in gain and offset. An input signal is needed to drive such an estimation, either in the form of a test signal with known characteristics or the regular but unknown input signal. Using the unknown input signal for estimation is preferred as the sub-ADC being estimated would not have to be disconnected from normal operation, an operation that in itself may influence the behavior of the sub-ADC being estimated.

SUMMARY

The inventors have realized that improved error estimation can be enabled by dividing the sub-ADCs of a TI-ADC into a first subset, subject to error estimation, and second subset, not subject to error estimation, and assigning input signal samples to sub-ADCs in the first subset according to a first scheme and to sub-ADCs in the second subset according to a second scheme, different from the first scheme. This allows for scheduling the sub-ADCs in the first subset more freely, such that, for instance, the impact of certain input signal components on the error estimation may be suppressed.

According to a first aspect, there is provided a TI-ADC comprising a group of sub-ADCs. During operation, $M \geq 2$ of the sub-ADCs are simultaneously operated for converting M respective consecutive input signal samples of the TI-ADC from an analog to a digital representation. The total number of sub-ADCs in the group is M+N, where $N \geq 1$. The TI-ADC comprises error-estimation circuitry for estimating errors of the sub-ADCs. Furthermore, the TI-ADC comprises a control circuit configured to, for each input signal sample, assign which sub-ADC is to operate on that input signal sample. The control circuit is configured to, for sub-ADCs in a first subset of the group of sub-ADCs, which are subject to error estimation by the error-estimation circuitry, perform the assignment according to a first scheme. Moreover, the control circuit is configured to, for sub-ADCs in a second subset of the group of sub-ADCs, which are not subject to error estimation by the error-estimation circuitry, perform the assignment according to a second scheme, different from the first scheme.

In some embodiments, the estimated errors include one or more of a DC offset error, a gain error, and a timing error.

Samples may be grouped into frames. Each frame may consist of M consecutive samples. The frames may be numbered such that, for any integer j, frame j+1 follows directly after frame j. In some embodiments, according to the first scheme, the control circuit is configured to, for any integer j, assign sub-ADCs from the first subset such that, if a sub-ADC is assigned to a sample in frame j, the next sample it is assigned to belongs to an interval of samples in frame j+2 or later. The interval may be determined by non-negative integers $R_1$ and $R_2$, $R_2 > R_1$, such that the interval starts $R_1$ samples and ends $R_2$ samples from the first sample in frame j+2. The control circuit may be configured to, according to the first scheme, assign sub-ADCs of the first subset, which are assigned to samples in frame j, to samples in said interval using a random or pseudorandom selection.

In some embodiments, according to the first scheme, the control circuit is configured to assign each sub-ADC in the first subset to samples that are M+X samples apart, wherein X>1. The control circuit may be configured to to use the same X for each sub-ADC in the first subset. Alternatively, the control circuit may be configured to use different X for at least two of the sub-ADCs in the first subset, and if more than one sub-ADC is provisionally assigned to the same sample, apply a selection function to select which of the sub-ADCs is actually assigned to that sample. In some embodiments, X is constant over time. In other embodiments, X is variable over time.

According to a second aspect, there is provided an electronic apparatus comprising the TI-ADC of the first aspect. The electronic apparatus may, for instance, be a communication apparatus, such as, but not limited to, a wireless communication device for a cellular communications system or a base station for a cellular communications system.

According to a third aspect, there is provided an integrated circuit comprising the TI-ADC of the first aspect.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
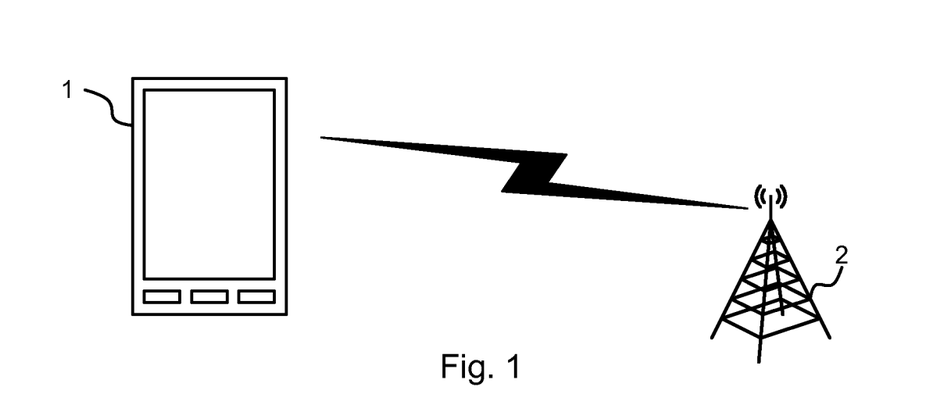
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of a radio base station 2 or wireless device 1. However, other types of communication apparatuses can be considered as well, such as a WiFi access point or WiFi enabled device.

Figure 2:
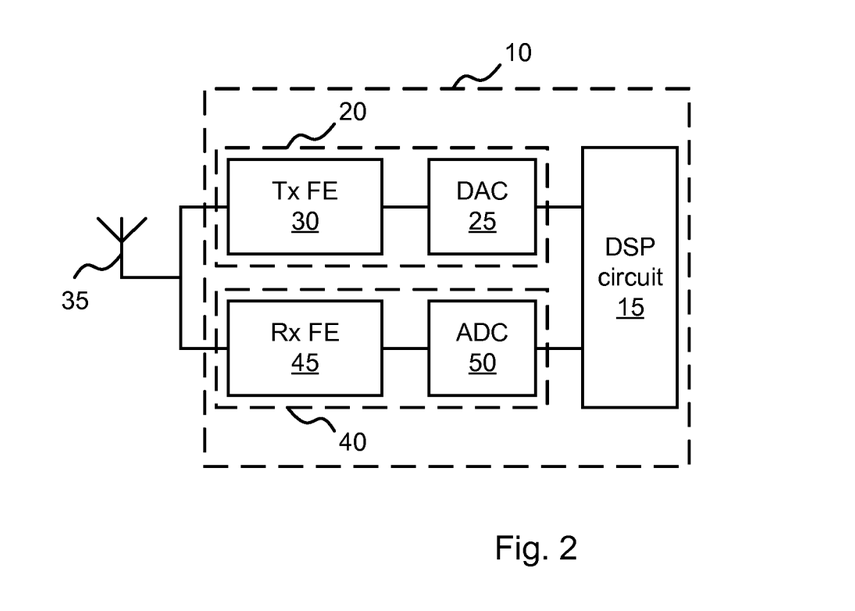
FIGS. 2-3 show block diagrams.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. In embodiments of this disclosure, the ADC 50 is a time-interleaved (TI) ADC. The TI-ADC 50 is connected between the Rx FE circuit 45 and the DSP circuit 15. The Rx FE circuit is 45 is configured to transform a signal received via the antenna 35 to a format suitable to be input to the TI-ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The TI-ADC 50 is configured to receive its (analog) input signal from the Rx FE circuit, and convert it to a digital representation to generate the digital output signal of the TI-ADC 50. This digital output signal of the ADC 50 is input to the DSP circuit 15 for further digital signal processing. It should be noted that embodiments of the TI-ADC 50 may be used in other types of electronic circuits than the transceiver circuit 10 used as an example above.

Figure 3:
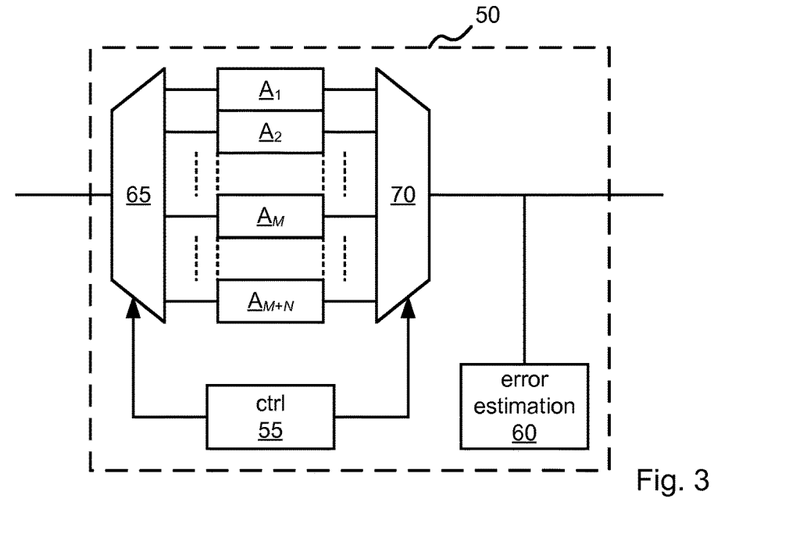

FIG. 3 is a block diagram of the TI-ADC 50 according to some embodiments. The TI-ADC 50 comprises a group of sub-ADCs $A_1$-$A_{M+N}$. During operation, $M \geq 2$ of the sub-ADCs $A_1$-$A_{M+N}$ are simultaneously operated for converting M respective consecutive input signal samples of the TI-ADC 50 from an analog to a digital representation. Each of said M consecutive samples is converted by one of the sub ADCs $A_1$-$A_{M+N}$. The total number of sub-ADCs $A_1$-$A_{M+N}$ in the group is M+N. The TI-ADC further comprises error-estimation circuitry 60 configured to estimate errors of the sub-ADCs $A_1$-$A_{M+N}$. For instance, the error-estimation circuitry 60 may be configured to estimate DC offsets of the sub-ADCs $A_1$-$A_{M+N}$, thus capturing DC offset variations between sub-ADCs. Alternatively or additionally, the error-estimation circuitry 60 may be configured to estimate gains of the sub-ADCs $A_1$-$A_{M+N}$, thus capturing gain variations between sub-ADCs. Further alternatively or additionally, the error-estimation circuitry 60 may be configured to estimate timing errors of the sub-ADCs $A_1$-$A_{M+N}$.

For comparison, using the notation of the present disclosure, a conventional TI-ADC has N=0. For such a traditional TI-ADC, there is exactly one sub-ADC available when a new sample is to be converted, and thus each sub ADC operates on every Mth sample. The estimation of sub-ADC errors may render incorrect results when the input signal processed by the TI-ADC contains high spectral density components at or in the proximity of the interleaving frequencies (m×$f_s$, where m is an integer and $f_s$ is the sub-ADC sampling rate). From the perspective of each individual sub-ADC any such signal will be folded to be at or in the proximity of DC. Thus, the DC offset estimation will incorrectly detect said signal as part of the DC offset. Also, as the offset estimation and correction effectively acts as a bandpass filter around the interleaving frequencies, the sub-ADC gain estimation may fail too as it will be based on the same signal.

In embodiments of the present disclosure, $N \geq 1$. During operation, there are thus N idle sub-ADCs and M sub-ADC that are operative to convert said M consecutive samples. For the next input sample, there are N+1 sub ADCs $A_i$ available that could be selected for converting that input sample, namely the N idle sub ADCs $A_i$ and one of the active sub ADCs $A_i$ that will be ready with its previous sample just in time to handle the next sample. Hence, there is a redundancy that, for instance, enables random or pseudo random selection of which sub ADC is to operate on what input sample. This is referred to as "randomization" in this disclosure. The general concept of randomization is known in the field of TI-ADCs, see for instance U.S. Pat. No. 9,525, 428 B2 mentioned in the background section.

The estimation problems mentioned above can be alleviated by the use of such randomization. However, with a small number of redundant sub-ADCs (N) there still exists some degree of periodicity since for each sample being processed by a given sub-ADC there is a minimum duration due to conversion time of said sub-ADC before it can be used again for another sample. Additionally, once a sub-ADC is available for conversion, the probability of it being used is the highest at its first available time instant since the same randomization policy should apply to all sub-ADCs (at any given time instant; all sub-ADCs available for selection have essentially the same probability of being selected). In this disclosure, the sampling function $g_j(t)$ of sub-ADC Aj is defined as $$g_j(t) = \sum_n a_j[n]\delta(t - nT) \text{ where} \quad (1)$$

$$a_j[n] = \begin{cases} 1 & \text{when } \textit{sub-ADC } A_j \text{ is used for converting sample } n \\ 0 & \text{otherwise} \end{cases}, \quad (2)$$

n is the sampling sequence index of the TI-ADC 50, $\delta(t)$ is the continuous time impulse function, and T is the sample period of the TI-ADC 50. The corresponding sampling function for the whole TI-ADC 50 is $$g(t) = \sum_{j=1}^{N+M} g_j(t) = \sum_n \delta(t - nT)$$

Figure 4:
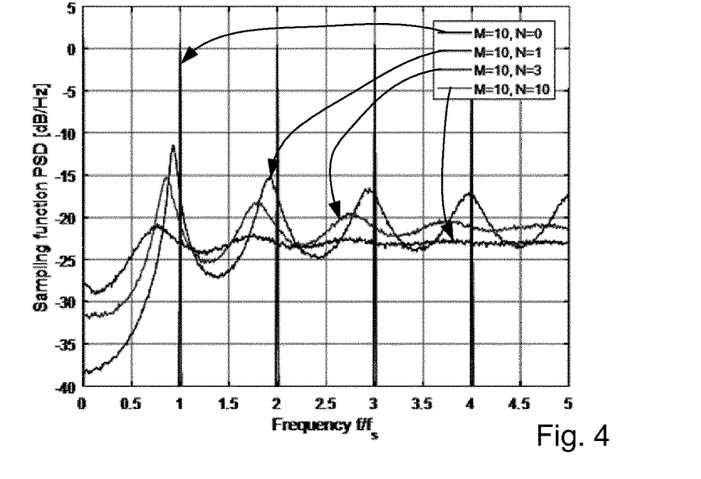
FIG. 4 shows spectra of sampling functions.

FIG. 4 shows the spectrum (Welch spectrum estimation with Hanning window) for the sampling function $g_j(t)$ for one sub-ADC $A_j$ in the TI-ADC 50 with M=10 and varying numbers (N) of redundant sub-ADCs. In FIG. 4, and other plots in this disclosure, $f_s$ denotes the "sub-ADC sampling rate" 1/(MT). The quotation marks are used since the sub-ADCs only operate at this rate in the non-redundant case N=0. For N≥1, the average sampling rate for each sub ADC is lower than $f_s$.

A brief explanation of sampling functions and the corresponding spectra is provided in the following: In the time domain, the sampling can be modeled by multiplying the time continuous input signal with the sampling function to yield a sequence of time discrete instants of the input signal. Multiplication in time domain corresponds to convolution in frequency domain. Thus, to understand the impact on sampling a signal from the viewpoint of a sub-ADC, one may first consider a case where the sub-ADC is scheduled with a fixed period $T_s$. A fixed period means equidistant positions of pulses in the sampling function (also referred to in the literature as a "Dirac comb"), which also translates to equidistant pulses in frequency domain with a separation of $1/T_s$. If a signal is close to any such pulses in the frequency domain, it means it will be translated to DC (through convolution), and hence there is a problem of distinguishing the signal from a real DC component (prior to sampling). If the randomization is applied the sampling function in frequency domain (/spectrum) is changed from discrete pulses to a continuous spectrum preferably as white as possible to minimize translation of an arbitrary signal to DC.

In FIG. 4, the non-redundant case (N=0) is included for comparison, in which case the sampling function is periodic, and the spectrum of the sampling function consists of discrete components at the so called interleaving frequencies, which are integer multiples of the sub-ADC sampling rate $f_s$. From the perspective of sub-ADC error estimation such a sampling function is not desired as signals near any of the interleaving frequencies will disturb the sub-ADC error estimation. For example, the DC offset estimation will not be able to distinguish the actual DC component from the slowly varying components of the disturbing signal near or overlapping any of the interleaving frequencies. For increasing N, the spectrum is slowly becoming whiter. But to obtain a decently white spectrum the number of redundant sub-ADCs, one should have N≳M.

Returning now to FIG. 3, embodiments of the TI-ADC 50 comprises a control circuit 55. The control circuit 55 is configured to, for each input signal sample, assign which sub-ADC $A_1$-$A_{M+N}$ is to operate on that input signal sample. As an illustrative example, the embodiment of the TI-ADC 50 illustrated in FIG. 3 comprises an analog demultiplexer 65 to distribute the current input sample to the currently selected sub-ADC $A_1$, and a digital multiplexer 70 to interleave the digital output samples from the sub-ADCs $A_1$-$A_{M+N}$ to a digital output signal of the TI-ADC 50, under control of the control unit 55.

According to embodiments of the present disclosure, the group of sub-ADCs $A_1$-$A_{M+N}$ is divided into two subsets, below denoted first subset and second subset. Below, sub-ADCs in the first subset are collectively labeled $A_{k1}$ and the sub-ADCs in the second subset are collectively labeled $A_{k2}$. Thus, the index k1 refers to any or all of the corresponding indices of the sub ADCs in the first subset, and the index k2 refers to any or all of the corresponding indices of the sub ADCs in the second subset. The sub-ADCs $A_{k1}$ in the first subset are subject to error estimation by the error-estimation circuitry 60. The sub-ADCs $A_{k2}$ in the second subset are not subject to error estimation by the error-estimation circuitry 60.

According to embodiments of the present disclosure, the control circuit 55 is configured to perform the assignment of input signal samples to sub-ADCs $A_{k1}$ in the first subset according to a first scheme and to sub-ADCs $A_{k2}$ in the second subset according to a second scheme, different from the first scheme. An effect of using different schemes for the first subset and the second subset is that it enables scheduling the sub-ADCs $A_{k1}$ in the first subset (i.e. those that are subject to error estimation) with sampling functions that are tailored to obtain error estimations that are less sensitive to disturbing signals compared with if the same scheme is used for all sub-ADCs $A_1$-$A_{M+N}$. This, in turn, means that a given accuracy requirement for the error estimations can be met with fewer sub-ADCs (i.e. lower N), compared with if the same scheme is used for all sub-ADCs $A_1$-$A_{M+N}$.

There are different ways that the sampling functions for the sub-ADCs $A_{k1}$ in the first subset can be tailored. For instance, in some embodiments it is desired that the error estimation be substantially equally sensitive to all input signal frequencies. In these embodiments, the spectra of the sampling functions should be "as white as possible". In other embodiments, it may be known that the input signal does not have any significant power at certain frequency bands it may be justified to have a sampling function, whose spectra have peaks in said frequency bands.

The control circuit can, for instance, be configured to first assign input signal samples to sub-ADCs $A_{k1}$ in the first subset using the first scheme to obtain the desired sampling function properties for these sub-ADCs $A_{k1}$. The remaining input signal samples, i.e. those that have not been assigned to sub-ADCs $A_{k1}$ in the first subset, can then be assigned to sub ADCs $A_{k2}$ in the second subset using the second scheme. Since the sub-ADCs in the second subset are not subject to error estimation, their sampling functions do not have to be tailored to have certain spectral properties for the purpose of accurate error estimation. The second scheme may for instance, in some embodiments, be a simple round-robin selection scheme. In other embodiments, other schemes, for instance including randomization, may be used as the second scheme.

To facilitate the description on various alternatives for the first scheme, we define a conversion frame as consisting of M consecutive TI-ADC samples. Thus, a sequence of consecutive TI-ADC samples may be divided into a sequence of conversion frames. This is illustrated with a diagram in FIG. 5, where each square represents a sample. The samples in each frame are labeled 1 through M in consecutive order. Furthermore, the frames are numbered such that, for any integer j, frame j+1 follows directly after frame j, etc.

Figure 5:
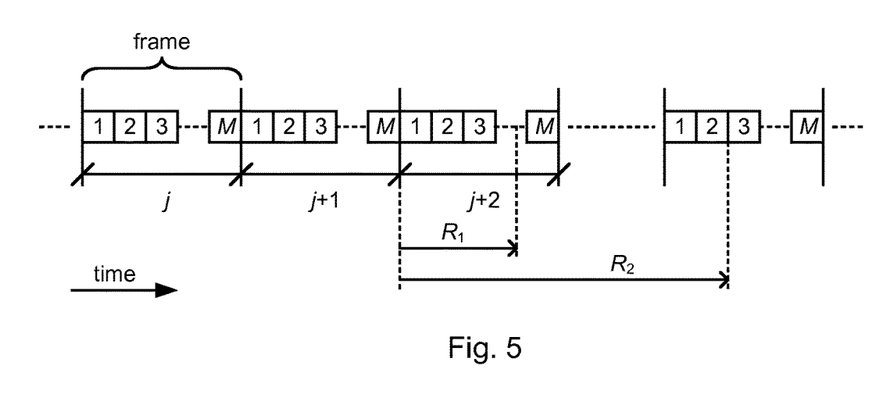
FIG. 5 is a diagram that illustrates a sequence of consecutive TI-ADC samples divided into a sequence of conversion frames.

It can be noted that, if a sub-ADC is assigned to sample $k \in [1, M]$ in frame j, the next available sample that it can be assigned to is sample k in frame j+1. Thus, if we try to assign the sub-ADC to a sample in frame j+1, this cannot be done freely (unless k=1) but is restricted to the samples k, k+1, ... M of frame j+1 (since the sub ADC is not finished with processing its previous sample until sample k of frame j+1). On the other hand, if the next sample the sub-ADC is assigned to belongs to an interval of samples in frame j+2 or later frames (i.e. the samples in frame j+1 are avoided), the sub-ADC can be freely assigned to any sample within this interval. This can, for instance, be utilized to obtain a relatively efficient randomization.

In some embodiments, the control circuit 55 is, in line with the discussion above and according to the first scheme, configured to, for any integer j, assign sub-ADCs $A_{k1}$ from the first subset such that, if a sub-ADC $A_{k1}$ is assigned to a sample in frame j, the next sample it is assigned to belongs to an interval of samples in frame j+2 or later. The interval may, for instance, be determined by non-negative integers $R_1$ and $R_2$, $R_2 > R_1$, such that the interval starts $R_1$ samples and ends $R_2$ samples from the first sample in frame j+2. The control circuit 55 may be configured to assign sub-ADCs $A_1$-$A_{M+N}$ of the first subset, which are assigned to samples in frame j, to samples in said interval using a random or pseudorandom selection. Since, as discussed above, all of these sub ADCs can be assigned to any sample in this interval, there is no restriction on the random (or pseudorandom) selection, which can thus be made relatively efficient, or "with a relatively high degree of randomness".

Figure 6:
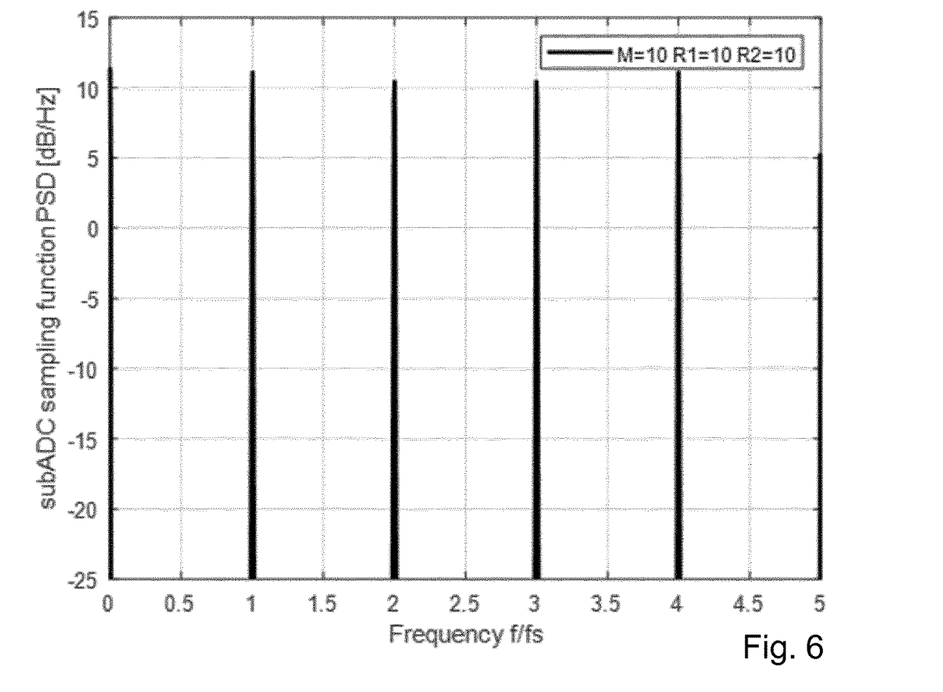
FIGS. 6-9 show spectra of sampling functions.

FIGS. 6-9 show the spectra (again Welch spectrum estimation with Hanning window) for the sampling function $g_j(t)$ for one sub-ADC $A_j$ in the TI-ADC 50 with M=10, $R_1$=10, and $R_2$=10, 12, 20, and 30, respectively. In FIG. 6, $R_1 = R_2 = M$ and thus there is no randomization for the sub-ADC being observed. The sub-ADC will be selected every Mth sample and thus the spectrum of the sampling function will consist of discrete pulses only at multiples of $f_s$.

Figure 7:
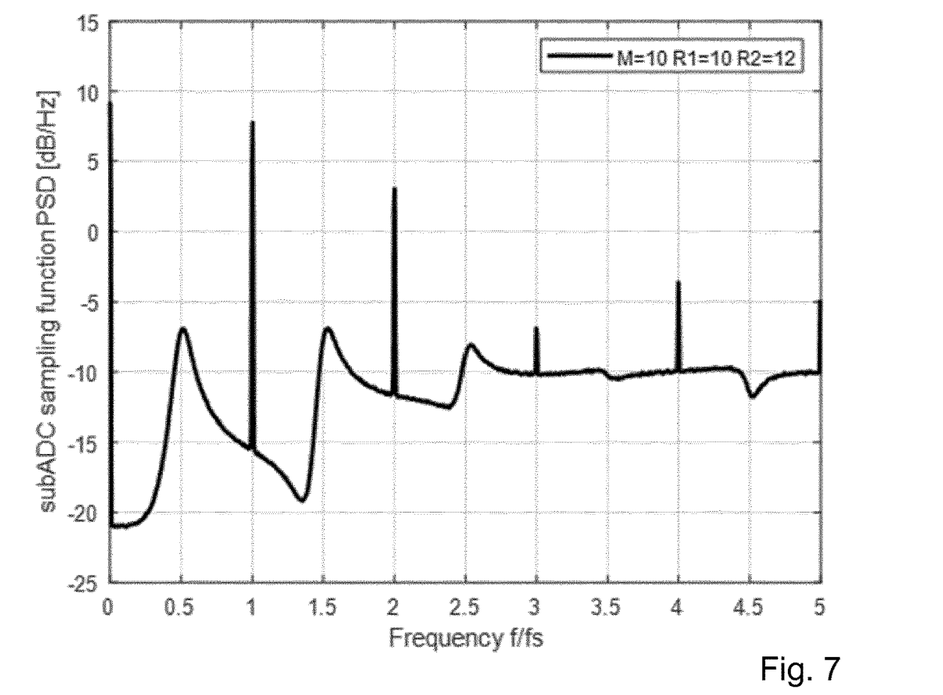
Figure 8:
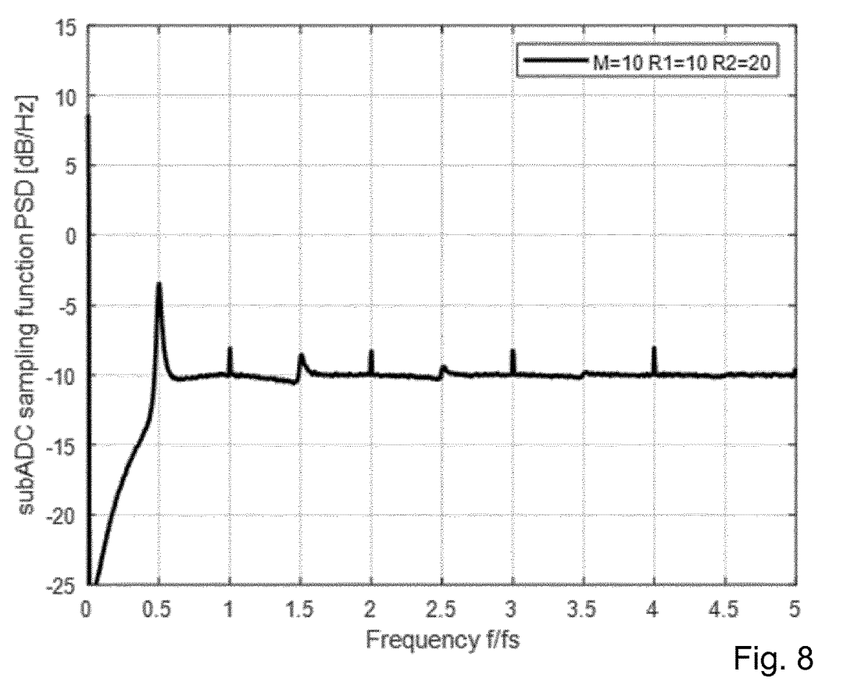
Figure 9:
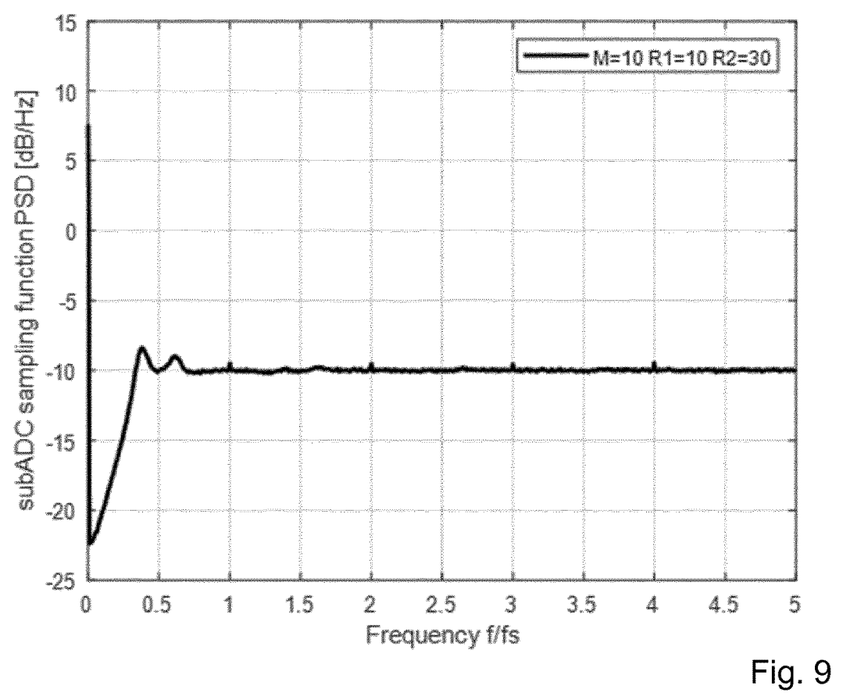

In FIG. 7, there is a limited range for randomization of the sub-ADC selection with $R_1$=10 and $R_2$=12. Thus, discrete pulses still exist but at lower levels than in FIG. 6, while there is now also a continuous spectrum due to the limited randomization. In FIGS. 8 and 9, $R_2$ is further increased (compared with FIG. 7), and the discrete pulses are reduced accordingly while the continuous spectrum becomes increasingly white.

According to some embodiments, the first selection scheme is configured to provide a peak in the spectrum of the sampling function in a certain frequency region. This frequency region may e.g. be a frequency region with negligible amount of signal energy in the input signal. For instance, in some embodiments, the control circuit 55 may, according to the first scheme, be configured to assign each sub-ADC $A_{k1}$ in the first subset to samples that are M+X samples apart, wherein X>1. In some embodiments, the control circuit 55 is configured to use the same X for each sub-ADC in the first subset. In other words, the sub-ADCs are all selected with the same periodicity. In other embodiments, the control circuit 55 is configured to use different X for at least two of the sub-ADCs $A_{k1}$ in the first subset. In this latter example, it may occasionally happen that more than one sub-ADC $A_{k1}$ is provisionally assigned to the same sample. The control unit 55 may then be configured to apply a selection function to select which of the sub-ADCs $A_{k1}$ is actually assigned to that sample. The selection function may e.g. be a random or pseudorandom selection function.

Furthermore, in some embodiments, X is constant over time. However, in other embodiments, X may be variable over time. In other words, the periodicity of the sampling function may be variable over time. For instance, the periodicity may vary according to a saw-tooth pattern, similar to a chirp function. This chirping of the sampling function can be used as an alternative to randomization for whitening the spectrum of the sampling function. Simulations have indicated that such chirping of the sampling function might not be as efficient for whitening the spectrum of the sampling function as the randomization illustrated in FIGS. 6-9. On the other hand, it can be simpler to implement in hardware.

Figure 10:
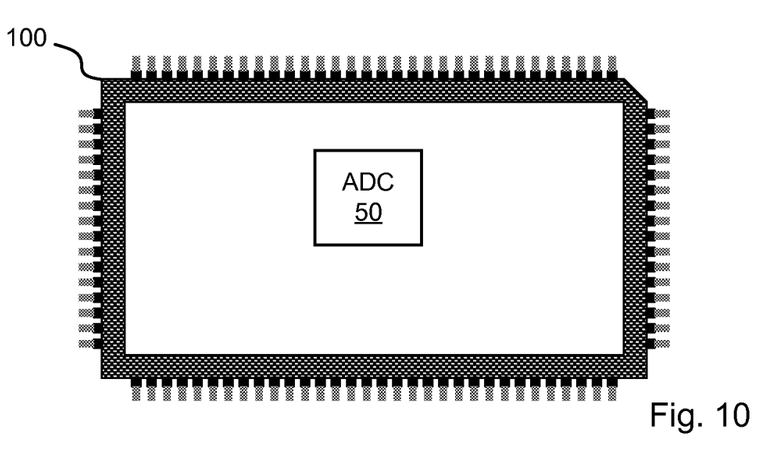
FIG. 10 illustrates an integrated circuit comprising a TI-ADC.

Embodiments of the TI-ADC 50 are suitable for integration in an integrated circuit. This is schematically illustrated in FIG. 10, showing an integrated circuit 100 comprising the TI-ADC 50.

It should be noted that, in some embodiments, the first and second subsets are not static subsets. For instance, at some instant $t_1$, a first division into the first subset and second subset may be applied, where some sub-ADCs may be included in the first subset, whereas the rest of the sub-ADCs are included in the second subset. This division into subsets may be used for a period of time until a later instant $t_2$. At instant $t_2$, a second division of sub-ADCs into the first subset and second subset may be applied, where at least some of the sub-ADCs, or all, in the first subset were in the second subset at instant $t_2$. This second division into subsets may be used for a period of time until a later instant $t_3$, at which a third division of sub ADCs into the first subset and second subset may be applied, etc. The third division into subsets may, in some embodiments, be the same as the first division into subsets.

The disclosure above refers to specific embodiments. However, other embodiments than the above described are possible within the scope of the invention. For example, the TI-ADC 50 may be used in other types of electronic apparatuses than communication apparatuses. The different features and steps of the embodiments may be combined in other combinations than those described.

The invention claimed is:

1. A time-interleaved, analog-to-digital converter (TI-ADC) comprising:
M+N sub-ADCs ($A_1$–$A_{M+N}$), wherein:
$M \geq 2$ and $N \geq 1$, and
M of the sub-ADCs ($A_1$–$A_{M+N}$) are configured to simultaneously convert M respective consecutive input signal samples of the TI-ADC from an analog to a digital representation;
error-estimation circuitry configured to estimate errors of the sub-ADCs ($A_1$–$A_{M+N}$); and
a control circuit configured to, for each input signal sample, assign which one of the sub-ADCs ($A_1$–$A_{M+N}$) is to operate on that input signal sample based on the following:
a first scheme for sub-ADCs ($A_{k1}$) in a first subset, of the sub-ADCs ($A_1$–$A_{M+N}$), that are subject to error estimation by the error-estimation circuitry; and
a second scheme, different from the first scheme, for sub-ADCs ($A_{k2}$) in a second subset, of the sub-ADCs ($A_1$–$A_{M+N}$), that are not subject to error estimation by the error-estimation circuitry.

2. The TI-ADC of claim 1, wherein the estimated errors include one or more of the following: a DC offset error, a gain error, and a timing error.

3. The TI-ADC of claim 1, wherein:
the input signal samples are grouped into frames;
each frame consists of M consecutive input signal samples;
the frames are numbered such that, for any integer j, frame j+1 follows directly after frame j; and
the control circuit is configured to assign based on the first scheme by assigning, for any integer j, sub-ADCs ($A_{k1}$) from the first subset such that, if a sub-ADC ($A_{k1}$) is assigned to an input signal sample in frame j, a next input signal sample that sub-ADC ($A_{k1}$) is assigned to belongs to an interval of input signal samples in frame j+2 or later.

4. The TI-ADC of claim 3, wherein:
the interval starts $R_1$ input signal samples and ends $R_2$ input signal samples from a first input signal sample in frame j+2; and
$R_1$ and $R_2$ are non-negative integers and $R_2 > R_1$.

5. The TI-ADC of claim 3, wherein the control circuit is configured to assign based on the first scheme by assigning sub-ADCs ($A_{k1}$) of the first subset, which are assigned to samples in frame j, to input signal samples in said interval using a random or pseudorandom selection.

6. The TI-ADC of claim 1, wherein the control circuit is configured to assign based on the first scheme by assigning each sub-ADC ($A_{k1}$) in the first subset to input signal samples that are M+X samples apart, wherein $X > 1$.

7. The TI-ADC of claim 6, wherein the control circuit is configured to assign based on the first scheme by using the same X for each sub-ADC in the first subset.

8. The TI-ADC of claim 6, wherein the control circuit is configured to assign based on the first scheme by:
using different X for at least two of the sub-ADCs ($A_{k1}$) in the first subset; and
when more than one sub-ADC ($A_{k1}$) is provisionally assigned to a same input signal sample, applying a selection function to select which of the sub-ADCs ($A_{k1}$) is actually assigned to that input signal sample.

9. The TI-ADC of claim 6, wherein X is constant over time.

10. The TI-ADC of claim 6, wherein X is variable over time.

11. An electronic apparatus comprising the TI-ADC of claim 1.

12. The electronic apparatus of claim 11, wherein the electronic apparatus is a communication apparatus.

13. The electronic apparatus of claim 12, wherein the communication apparatus is a wireless communication device for a cellular communications system.

14. The electronic apparatus of claim 12, wherein the communication apparatus is a base station for a cellular communications system.

15. An integrated circuit comprising the TI-ADC of claim 1.

* * * * *